(12) United States Patent
Mori et al.

(10) Patent No.: US 6,437,455 B2
(45) Date of Patent: *Aug. 20, 2002

(54) SEMICONDUCTOR DEVICE HAVING GATE-GATE, DRAIN-DRAIN, AND DRAIN-GATE CONNECTING LAYERS AND METHOD OF FABRICATING THE SAME

(75) Inventors: Katsumi Mori, Sakata; Kei Kawahara, Isahaya; Yoshikazu Kasuya, Sukato, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/758,390

(22) Filed: Jan. 12, 2001

(30) Foreign Application Priority Data

Jan. 14, 2000 (JP) .......................... 2000-006677

(51) Int. Cl.⁷ .............................................. H01L 27/11
(52) U.S. Cl. ...................... 257/903; 257/369; 257/393; 257/401; 257/758; 438/152
(58) Field of Search .................. 257/393, 903, 257/401, 327, 369, 383, 385, 351; 438/152; 365/182

(56) References Cited

U.S. PATENT DOCUMENTS 5,394,358 A * 2/1995 Huang ......................... 365/182
5,521,860 A * 5/1996 Ohkubo ....................... 365/154
5,754,468 A * 5/1998 Hobson ....................... 365/156
5,930,163 A   7/1999 Hara et al. ................... 365/154
6,147,385 A * 11/2000 Kim et al. .................... 257/369

FOREIGN PATENT DOCUMENTS

JP   10-41409    2/1998
JP   10-178110   6/1998

OTHER PUBLICATIONS

M. Ishida et al., IEDM Technical Digest (1998). p. 203.
U.S. application No. 09/736,386, filed Dec. 15, 2000, Kumagai et al.

\* cited by examiner

*Primary Examiner*—Hoai V. Ho
*Assistant Examiner*—Tu-Tu Ho
(74) *Attorney, Agent, or Firm*—Oliff & Berridge, PLC

(57) ABSTRACT

A semiconductor memory device comprising first and second gate-gate connecting layers, first and second drain-drain connecting layers, and first and second drain-gate connecting layers. The first and second gate-gate connecting layers respectively connect a gate of a driver transistor to a gate of a load transistor. The first and second drain-drain connecting layers are formed over a first interlayer dielectric and have a refractory metal nitride layer. The first and second drain-drain connecting layers respectively connect a drain of the driver transistor to a drain of the load transistor. The first and second drain-gate connecting layers are formed over a second interlayer dielectric, and respectively connect the first drain-drain connecting layer to the second gate-gate connecting layer, and the second drain-drain connecting layer to the first gate-gate connecting layer.

21 Claims, 9 Drawing Sheets

SEMICONDUCTOR DEVICE HAVING GATE-GATE, DRAIN-DRAIN, AND DRAIN-GATE CONNECTING LAYERS AND METHOD OF FABRICATING THE SAME

BACKGROUND OF THE INVENTION

1. Field of the Invention

The present invention relates to a semiconductor memory device and a method of fabricating the same. More particularly, the present invention relates to a static random access memory (SRAM) and a method of fabricating the same.

2. Description of Related Art

An SRAM is one type of semiconductor memory device and does not need refreshing. Therefore, the SRAM enables system configuration to be simplified and consumes only a small amount of current in a wait mode. Because of this, the SRAM is suitably used as a memory for portable devices such as a portable telephone in which the number of parts is limited and the power consumption therefor is required to be small.

The SRAM generally stores information using a flip-flop formed of two inverters, each having a load transistor and a driver transistor. The flip-flop is formed by connecting the gate electrode of one inverter to the drain of the other inverter. Specifically, the flip-flop is formed by cross-coupling one inverter with the other.

At present, miniaturization of portable devices is strongly demanded. As a means to achieve such a demand, miniaturization of memory cells of the SRAM has been demanded. For example, miniaturization of an SRAM by forming a flip-flop using two layers has been attempted.

In the case of forming a flip-flop using two layers, a layer for connecting the drains of each inverters and a layer for connecting the drain and the gate of the inverter can be cross-coupled by forming these layers as one conductive layer. According to this structure, such a conductive layer is formed over the regions including a region in which the drain of one inverter is formed, a region in which the gate of the other inverter is formed, and a region which connects these regions. Therefore, the conductive layer has a pattern with three ends (for example, a pattern having a branched portion in the shape of the letters "T" or "h"), or a spiral pattern in which the arms are intricate. For example, a pattern having a branched portion in the shape of the letter "T" is disclosed by Japanese Patent Application Laid-open No. 10-41409 in FIG. 1. A pattern with a branched portion in the shape of the letter "T" is also disclosed by M. Ishida, et. al. in *International Electron Devices Meeting Technical Digest,* 1998, page 203, FIG. 4(*b*). An example of a spiral pattern also can be seen in this *International Electron Devices Meeting Technical Digest,* page 203, FIG. 3(*b*).

However, in the case of SRAMs having such patterns, since the flip-flop is formed using two layers, the patterns of each layer are complicated. Therefore, it is difficult to reproduce the shape of a minute pattern in a photoetching step with high accuracy, whereby a desired pattern cannot be obtained. This hinders miniaturization of the memory size.

SUMMARY OF THE INVENTION

An objective of the present invention is to provide a semiconductor memory device having memory cells with a reduced size.

Another objective of the present invention is to provide a method of fabricating a more miniaturized semiconductor memory device.

According to a first aspect of the present invention, there is provided a semiconductor memory device comprising:
memory cells each of which includes two load transistors, two driver transistors, and two access transistors, wherein:
- each of the memory cells includes first and second gate-gate connecting layers, first and second drain-drain connecting layers, and first and second drain-gate connecting layers;
- the first and second gate-gate connecting layers are formed over a semiconductor substrate;
- the first and second drain-drain connecting layers are formed over a first interlayer dielectric and connect drains of the load transistors with drains of the driver transistors;
- the first and second drain-gate connecting layers are formed over a second interlayer dielectric;
- the first drain-gate connecting layer connects the first drain-drain connecting layer to the second gate-gate connecting layer;
- the second drain-gate connecting layer connects the second drain-drain connecting layer to the first gate-gate connecting layer; and
- the first and second gate-gate connecting layers, the first and second drain-drain connecting layers, and the first and second drain-gate connecting layers are formed in different layers.

In the semiconductor memory device of the present invention, the first and second gate-gate connecting layers are formed over the semiconductor substrate, the first and second drain-drain connecting layers are formed over the first interlayer dielectric, and the first and second drain-gate connecting layers are formed over the second interlayer dielectric, wherein a flip-flop is formed in the memory cell by these three layers. Therefore, the patterns of these layers can be simplified in comparison with a case of forming a flip-flop using two layers, thereby achieving miniaturization of the semiconductor memory device.

The semiconductor memory device of the present invention has modifications as follows.

(1) Each of the first and second drain-drain connecting layers may preferably have a thickness of 50 to 200 nm, and still more preferably 100 to 150 nm. Each of the first and second drain-drain connecting layers may preferably have a sheet resistance of 50 $\Omega/\square$ or less, and still more preferably 15 $\Omega/\square$ or less. According to this configuration, a drain-drain connecting layer having a thickness and resistance appropriate to the use of the device can be obtained. If the drain-drain connecting layers have the above thickness, the focus margin can be increased when patterning the drain-drain connecting layers. This increases the wiring density and yield of the drain-drain connecting layers.

(2) The semiconductor memory device may further comprise first contact portions formed in the first interlayer dielectric, second contact portions formed in the second interlayer dielectric, and third contact portions formed through the first interlayer dielectric and second interlayer dielectric. If there are provided the third contact portions, it is not necessary to form connecting layers which connect the first contact portions to the second contact portions. Therefore, in a minute region, a degree of freedom relating to the location of the contact portions can be ensured by forming the third contact portions, thereby enabling the memory size to be reduced.

In this modification, the first and second gate-gate connecting layers may be connected to the first and second drain-drain connecting layers by the first contact portions.

Moreover, the first and second gate-gate connecting layers may be connected to the first and second drain-gate connecting layers by the third contact portions.

In this modification, first contact pad layers may be formed in the same step of forming the first and second drain-drain connecting layers and used to connect a bit line to source/drain regions of the access transistors. The second contact portions may be formed over the first contact portions with the first contact pad layers interposed.

The contact pad layer is a conductive layer formed between two contact portions stacked in the direction perpendicular to the surface of the semiconductor substrate over which the transistors are formed. According to this configuration, the second contact portions can be securely connected to the first contact portions.

In this case, the second contact portions may be formed over the first and second drain-drain connecting layers and connect the first and second drain-drain connecting layers to the first and second drain-gate connecting layers.

Contact holes in the third contact portions may have an aspect ratio of preferably 6 or less, and still more preferably 5 or less. The aspect ratio is the ratio of the depth of a contact hole to the lower end diameter of the contact hole. According to this configuration, opening can be formed securely in contact portions with a small diameter, whereby the drain-drain connecting layers can be connected to the drain-gate connecting layers.

(3) Each of the first and second drain-drain connecting layers may include are fractory metal nitride layer. According to this configuration, a thinner layer can be formed whereby processing with higher accuracy can be ensured. Such a thinner layer increases the focus margin when patterning the layer due to small difference in the steps, thereby increasing the wiring density and yield of the drain-drain connecting layers.

In this case, each of the first and second drain-drain connecting layers may further include a refractory metal layer. According to this configuration, the drain-drain connecting layers can be provided with lower resistance, and the thickness thereof can be decreased.

(4) An insulating layer containing silicon nitride and silicon oxide may be formed over the semiconductor substrate. According to this configuration, effects caused by the deviation of the positions of the first contact portions formed over the semiconductor substrate can be decreased for reasons to be described later.

(5) The distance between the semiconductor substrate and the first and second drain-drain connecting layers may be preferably 300 to 1000 nm, and still more preferably 600 to 800 nm. The distance between the first and second drain-drain connecting layers and the first and second drain-gate connecting layers may be preferably 200 to 600 nm, and still more preferably 300 to 500 nm. The distance between the semiconductor substrate and the first and second drain-gate connecting layers may be preferably 1400 nm or less. According to this configuration, the memory cell can be miniaturized.

(6) Each of the memory cells may include an upper wiring layer formed over a third interlayer dielectric. In this case, the upper wiring layer may be used as a bitline wiring layer.

According to a second aspect of the present invention, there is provided a method of fabricating a semiconductor memory device comprising the steps of:

(a) forming a plurality of memory cells in a predetermined regions of a semiconductor substrate, each of the memory cells including two load transistors, two driver transistors, and two access transistors;

(b) forming gate-gate connecting layers over the semiconductor substrate;

(c) forming a first interlayer dielectric over the semiconductor substrate and the gate-gate connecting layers;

(d) forming drain-drain connecting layers over the first interlayer dielectric;

(e) forming a second interlayer dielectric over the drain-drain connecting layers and the first interlayer dielectric; and (f) forming drain-gate connecting layers over the second interlayer dielectric.

According to this method of fabricating a semiconductor memory device, a semiconductor memory device of a reduced size can be fabricated with high accuracy. Therefore, a semiconductor memory device having drain-drain connecting layers which exhibit increased wiring density and yield can be obtained.

In this case, an insulating layer containing silicon nitride and silicon oxide may be formed over the semiconductor substrate after the step (b).

The method of fabricating a semiconductor memory device may further comprise the steps of:

(g) forming first contact portions in the first interlayer dielectric;

(h) forming third contact portions through the first interlayer dielectric and the second interlayer dielectric; and (i) forming second contact portions in the second interlayer dielectric.

According to this method of fabricating a semiconductor memory device, a semiconductor memory device having memory cells each of which is miniaturized can be obtained with high accuracy.

In this case, first contact pad layers which connect the first contact portions to the second contact portions may be formed over the first interlayer dielectric together with the first and second drain-drain connecting layer in the step (d).

DETAILED DESCRIPTION OF THE PREFERRED EMBODIMENT

Figure 2:
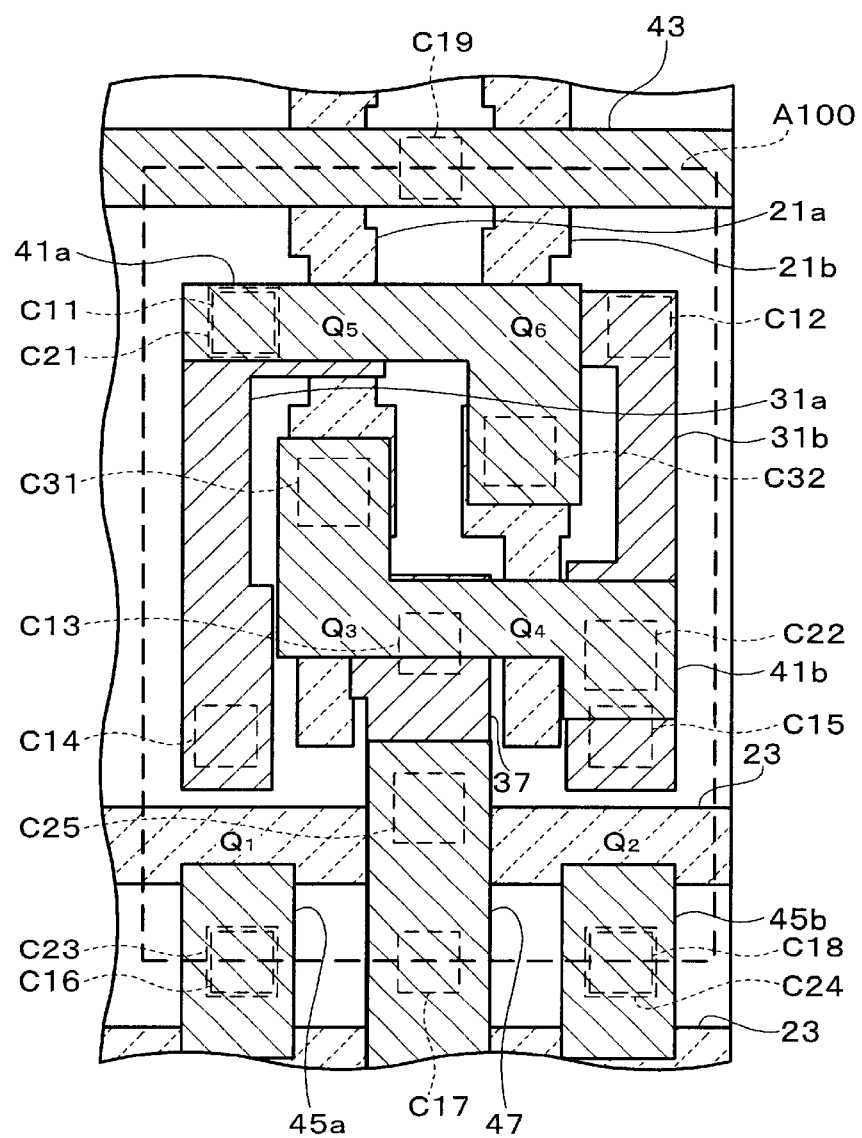
FIG. 2 is an enlarged view of a region A100 of the SRAM memory cells shown in FIG. 1.
Figure 3:
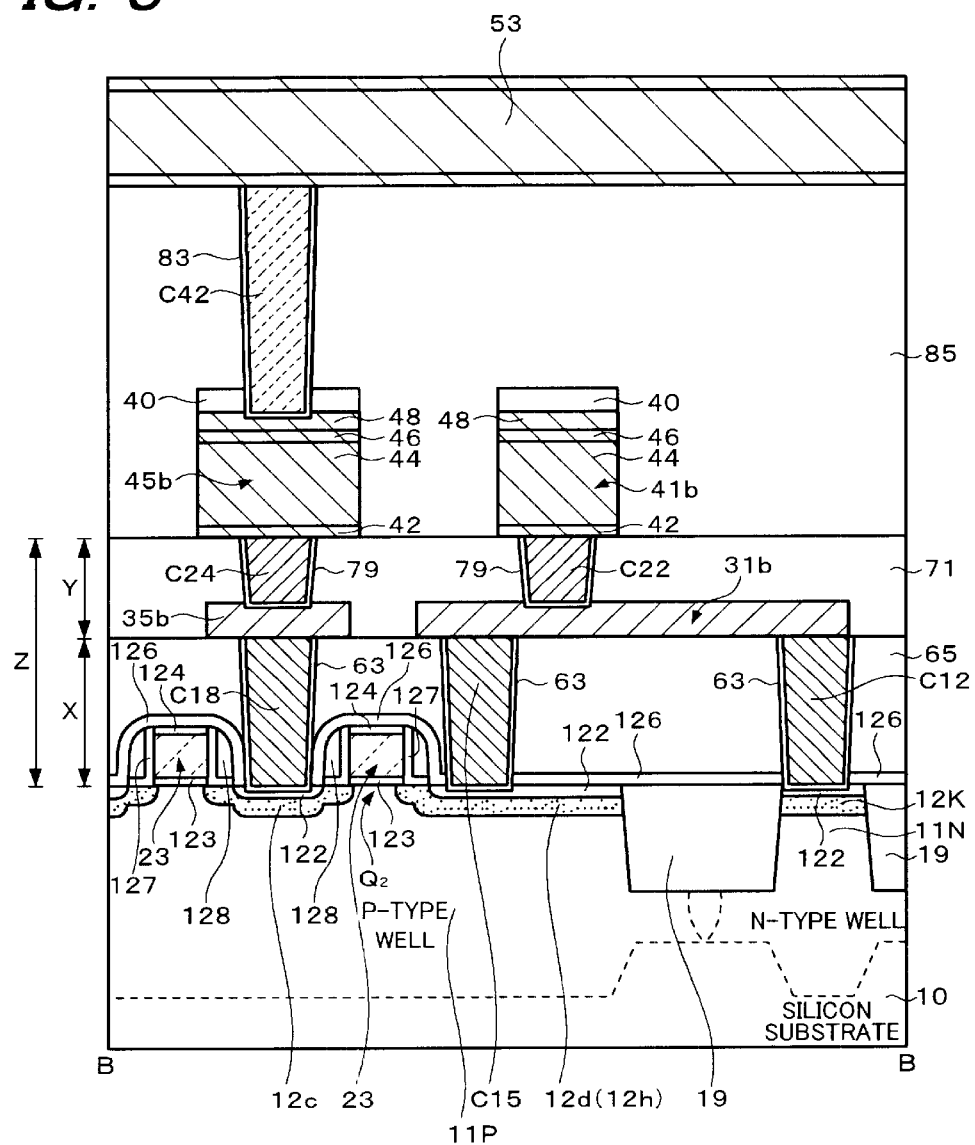
FIG. 3 is a cross section of the SRAM memory cell taken along line B—B of FIG. 1.
Figure 4:
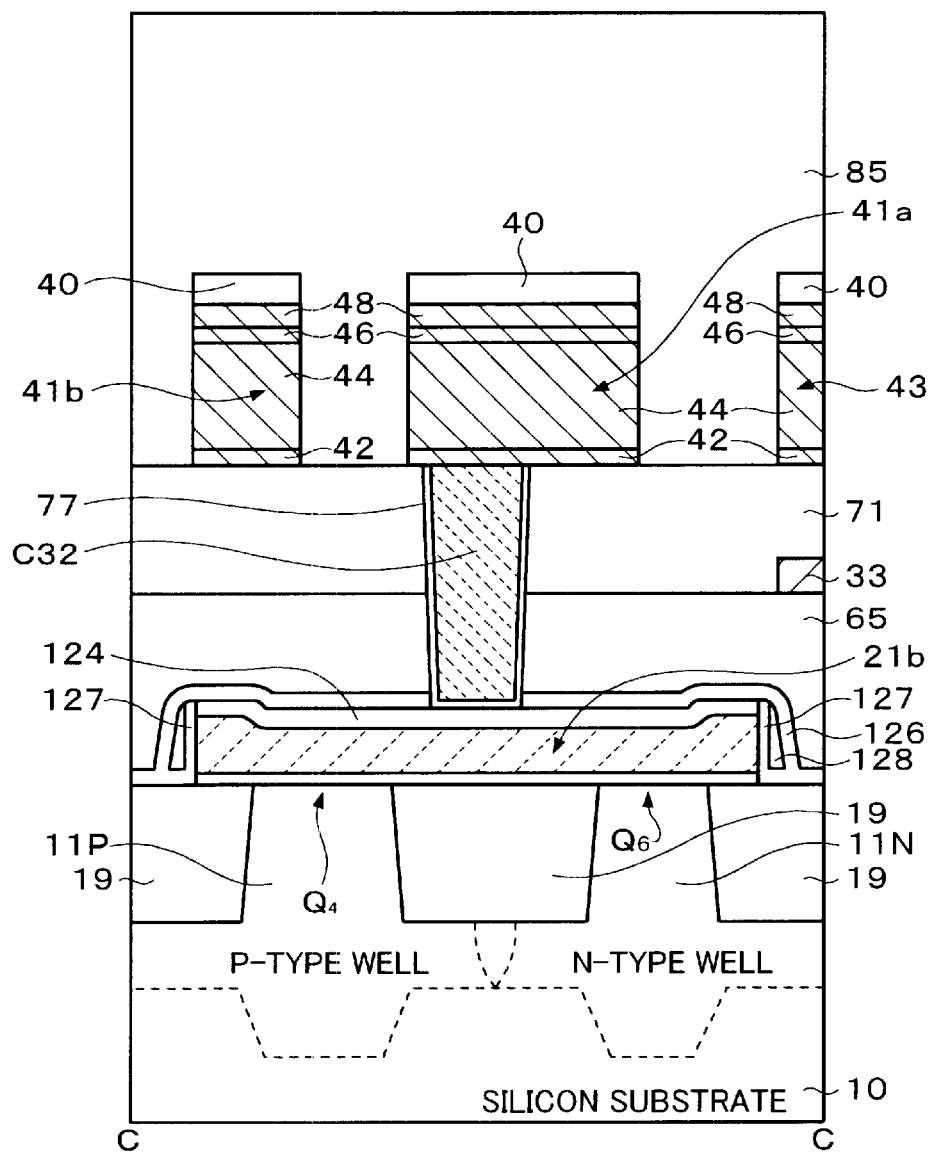
FIG. 4 is a cross section of the SRAM memory cell taken along line C—C of FIG. 1.
Figure 5:
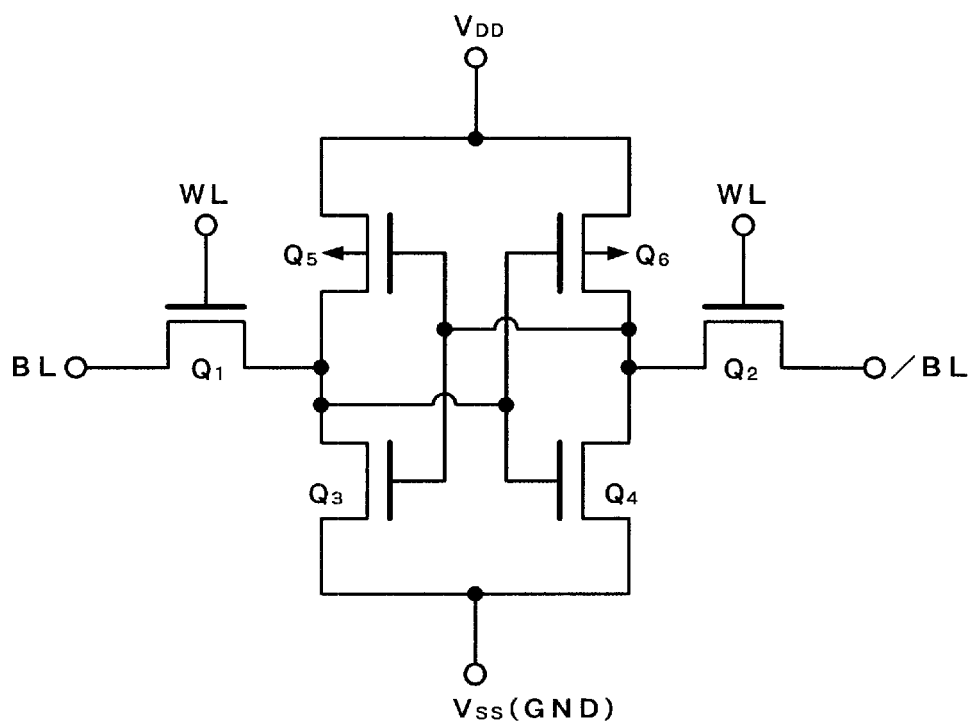
FIG. 5 is an equivalent circuit of an SRAM.
Figure 6:
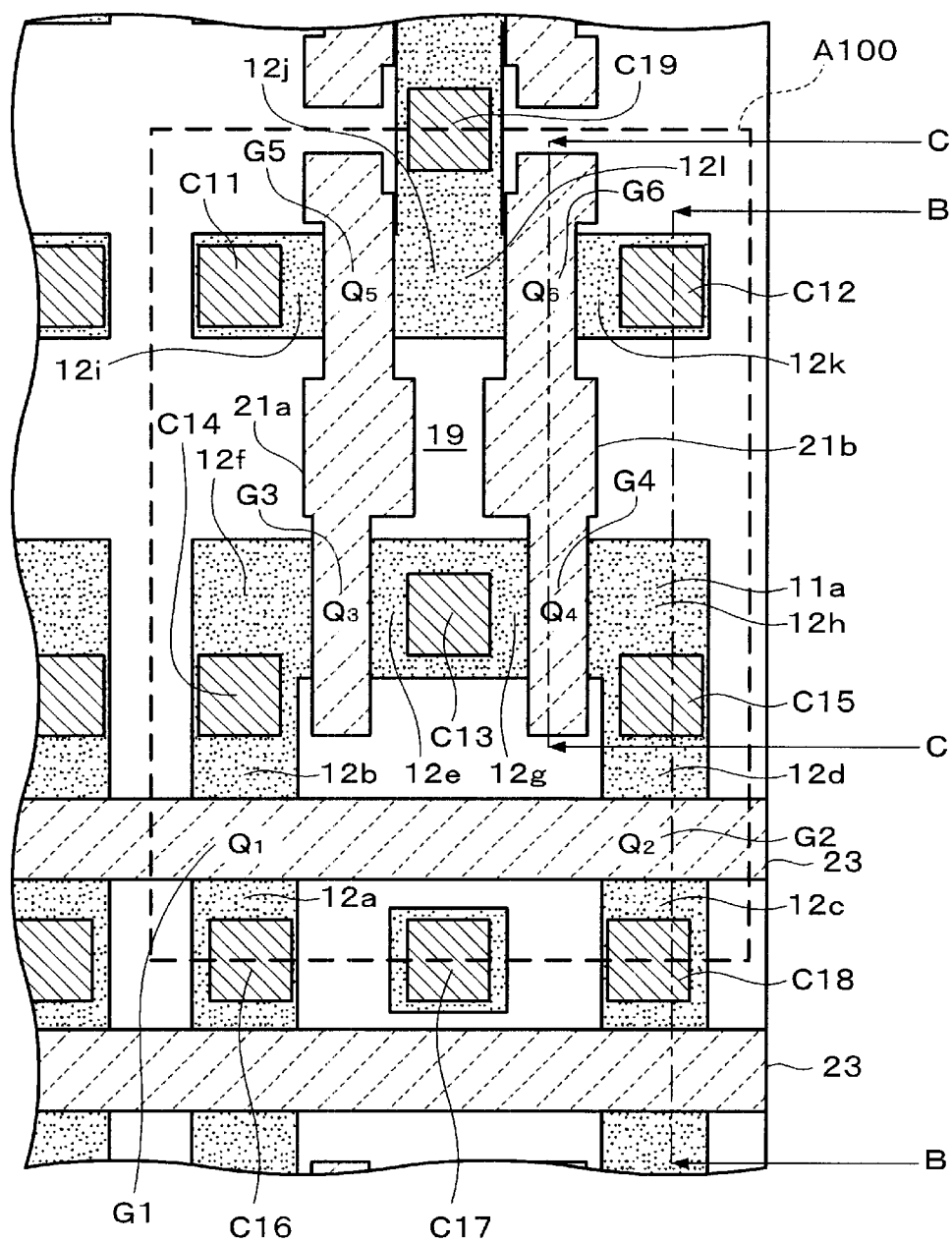
FIG. 6 is a plan view showing gate-gate connecting layers and source/drain regions of the SRAM memory cells shown in FIG. 1.
Figure 7:
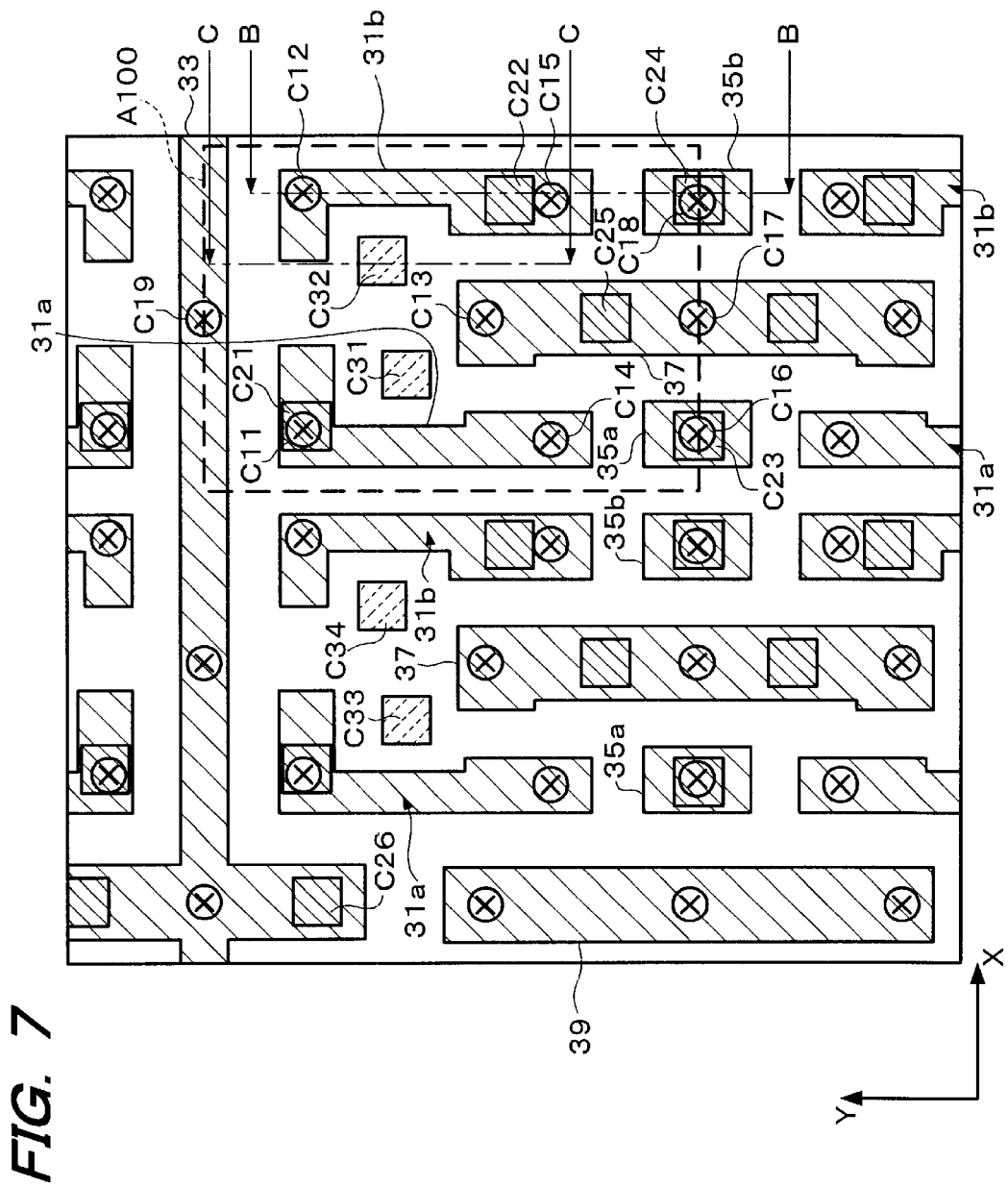
FIG. 7 is a plan view showing drain-drain connecting layers of the SRAM memory cells shown in FIG. 1.
Figure 8:
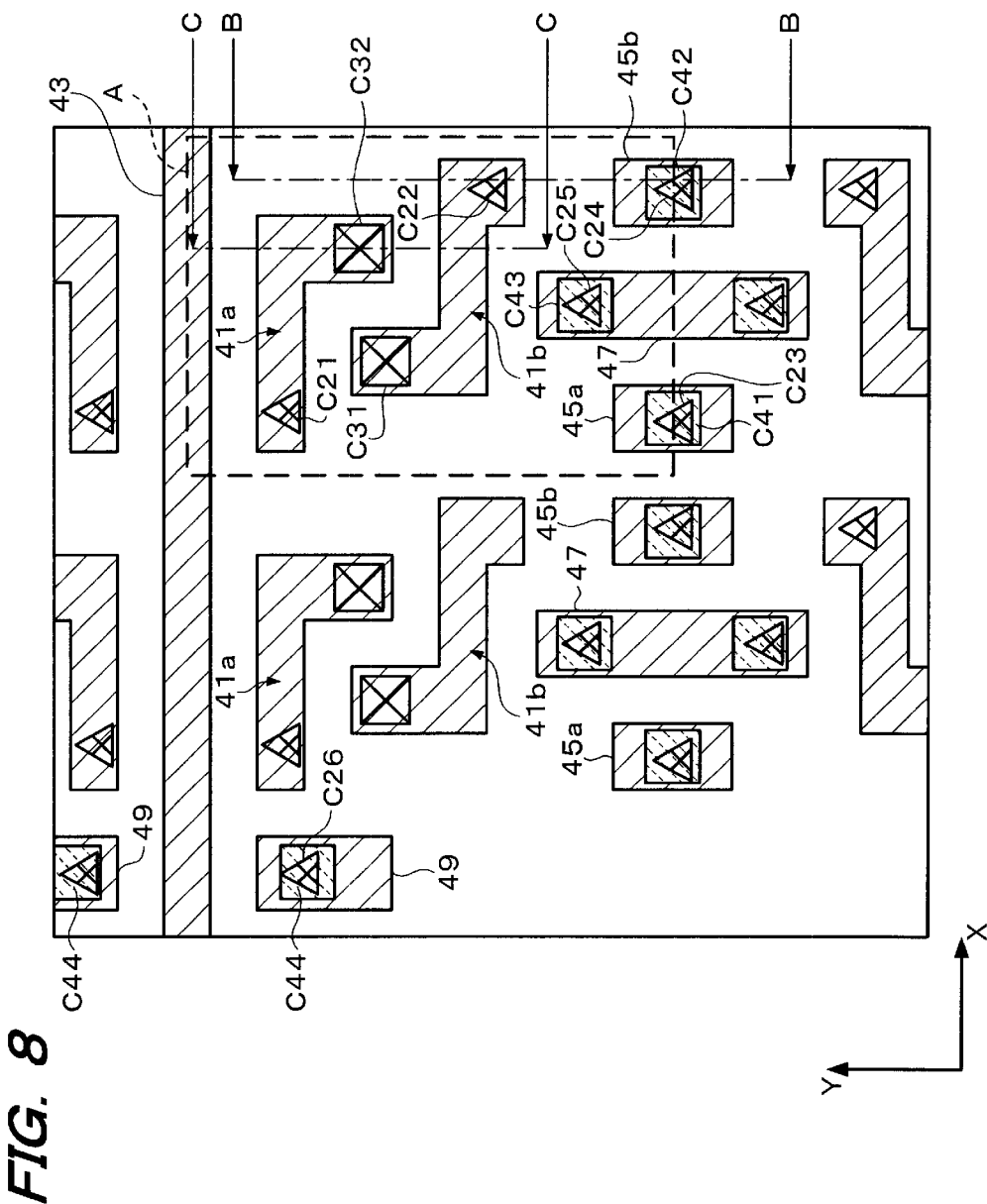
FIG. 8 is a plan view showing drain-gate connecting layers of the SRAM memory cells shown in FIG. 1.
Figure 9:
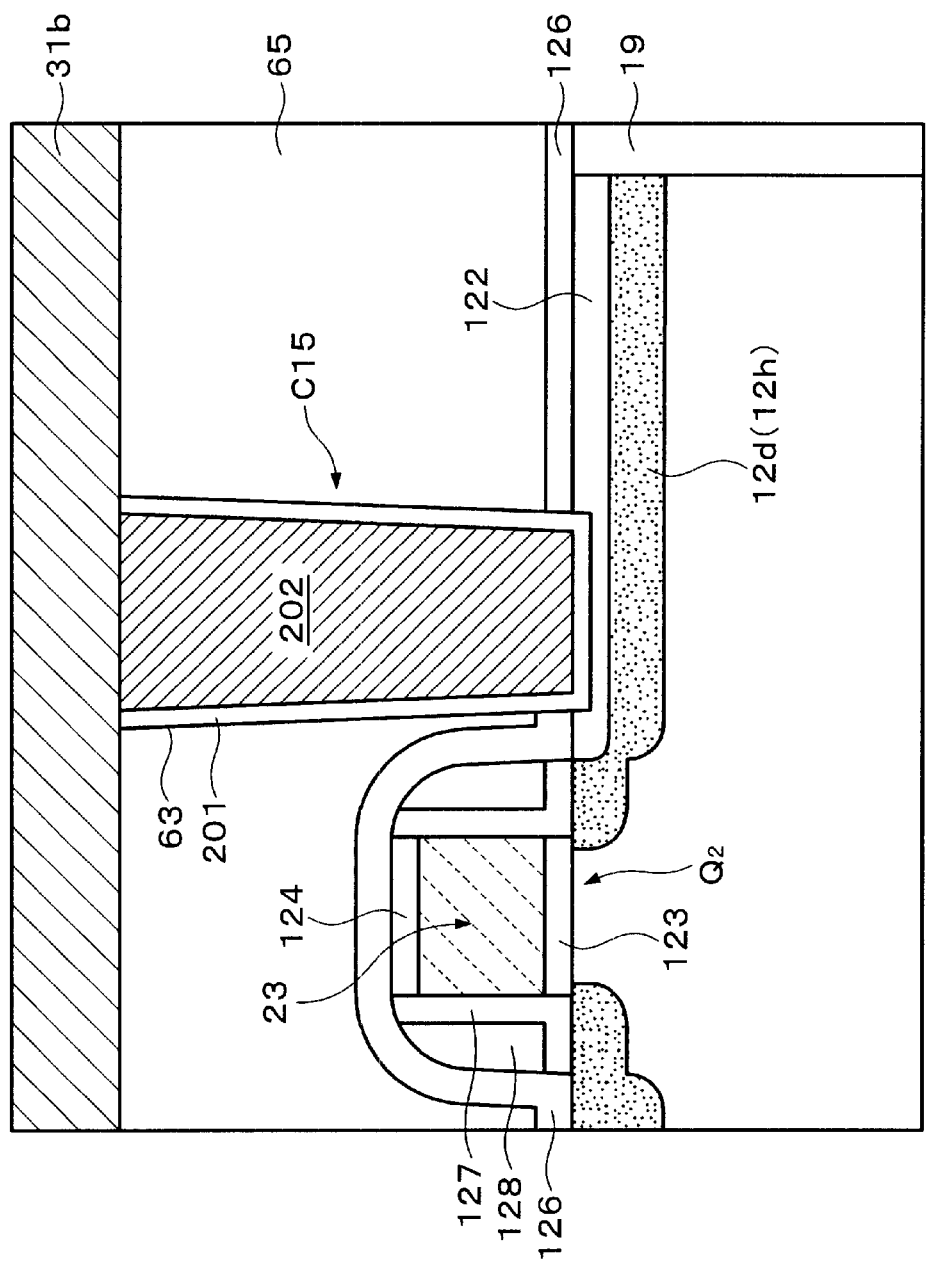
FIG. 9 is an enlarged cross-section of a contact portion C15 shown in FIG. 3.

An embodiment of a semiconductor memory device according to the present invention will be described. The present embodiment illustrates the case where the semiconductor memory device according to the present invention is applied to an SRAM. FIG. 1 and FIGS. 6 to 8 are plan views showing an example of memory cells for a full CMOS SRAM (hereinafter called "SRAM cells") according to the present embodiment. FIG. 2 is an enlarged view of a region A100 of FIG. 1. FIG. 6 is a view showing a lower layer (active region etc.) in the region shown in FIG. 2. FIG. 3 is a cross section taken along the line B—B of FIG. 1. FIG. 4 is a cross section taken along the line C—C of FIG. 1. FIG. 9 is an enlarged cross section showing a first contact portion C15 shown in FIG. 3. FIG. 5 is an equivalent circuit of the SRAM.

Device Structure

1. Planar structure

Figure 1:
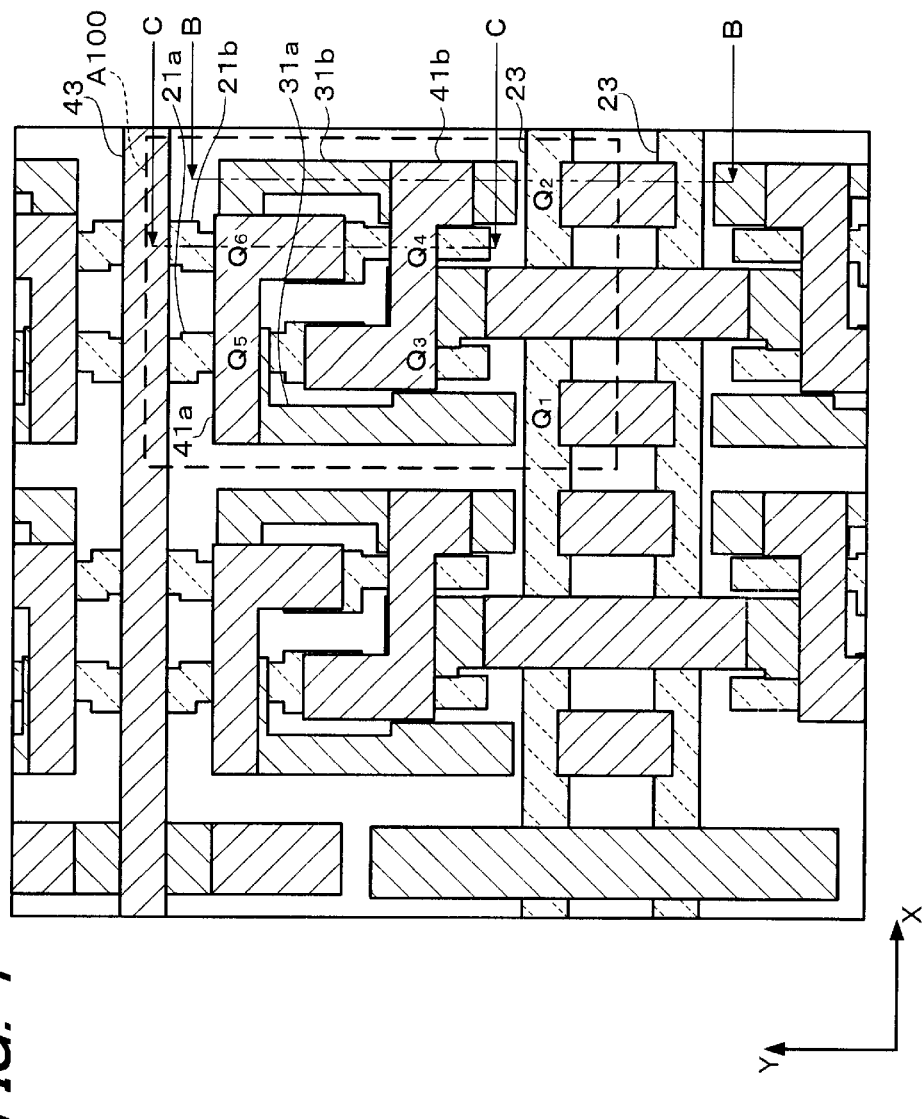
FIG. 1 is a plan view showing SRAM memory cells to which the present invention is applied.

FIG. 1 is a plan view showing a first conductive layer, second conductive layer, and third conductive layer of the SRAM cell according to the present embodiment. FIG. 2 is an enlarged view of the region A100 shown in FIG. 1. The SRAM cell has a structure in which the first conductive layer, second conductive layer, and third conductive layer are stacked over a silicon substrate 10 (described later) in that order and an interlayer dielectric is provided on each conductive layer. The first conductive layer includes gate-gate connecting layers 21a and 21b formed of polysilicon and a sub-word wiring layer (or sub-word line) 23, as shown in FIG. 6. The second conductive layer includes drain-drain connecting layers 31a and 31b and others, as shown in FIG. 7. The third conductive layer includes drain-gate connecting layers 41a and 41b and others, as shown in FIG. 8. The structure shown in FIG. 7 is positioned on the structure shown in FIG. 6, and the structure shown in FIG. 8 is positioned on the structure shown in FIG. 7. FIG. 1 shows these structures collectively.

FIG. 1 shows a portion which mainly forms a flip-flop. The region A100 in this portion will be described. The region A100 shows a region in which one memory cell is formed in FIG. 1, as well as in other figures. An equivalent circuit of the CMOS SRAM consisting of six transistors in the region A100 is shown in FIG. 5.

In the region A100, six transistors $Q_1$ to $Q_6$ are provided in each memory cell as shown in FIGS. 1, 2, and 5. Active regions are formed in an N-type well 11N (see FIG. 3). The load transistor $Q_5$ is formed in one active region and the load transistor $Q_6$ is formed in another active region. Active regions are also formed in a P-type well 11P (see FIG. 3). The access transistor $Q_1$ and the driver transistor $Q_3$ are formed in one active region. The access transistor $Q_2$ and the driver transistor $Q_4$ are formed in another active region.

The driver transistor $Q_3$ and the load transistor $Q_5$ form a CMOS inverter and the driver transistor $Q_4$ and the load transistor $Q_6$ also form a CMOS inverter. The flip-flop circuit is formed by connecting these inverters.

The gate-gate connecting layers 21a and 21b in the first conductive layer respectively have linear patterns, as shown in FIGS. 1, 2, and 6. The intersections of each of the gate-gate connecting layers 21a and 21b and the sub-word wiring layer 23 with the active regions respectively form gate electrodes G1, G2, G3, G4, G5, and G6, as shown in FIG. 6. Specifically, the gate-gate connecting layer 21a connects the gate electrode G3 of the driver transistor $Q_3$ with the gate electrode G5 of the load transistor $Q_5$. The gate-gate connecting layer 21b connects the gate electrode G4 of the driver transistor $Q_4$ with the gate electrode G6 of the load transistor $Q_6$. The gate lengths of the driver transistors $Q_3$ and $Q_4$ are 0.18 µm, for example. The gate lengths of the load transistors $Q_5$ and $Q_6$ are 0.20 µm, for example.

The sub-word wiring layer 23 is activated or deactivated by a main word wiring layer (main word line) 43 formed thereon. The sub-word wiring layer 23 connects the gate electrodes G1 and G2 of the access transistors $Q_1$ and $Q_2$. The gate lengths of these transistors are 0.24 µm, for example.

The drain-drain connecting layers 31a and 31b in the second conductive layer respectively have linear patterns as shown in FIGS. 1, 2, and 7, and connect the drains of each CMOS. The drain-drain connecting layers 31a and 31b are formed on a first interlayer dielectric 65 (described later; see FIG. 3) over the silicon substrate 10. First contact portions C11 to C19 (hereinafter called "contact portions C11 to C19") are formed in the first interlayer dielectric 65.

The drain-drain connecting layer 31a connects a drain region 12f of the driver transistor $Q_3$ to a drain region 12i of the load transistor $Q_5$ with the contact portions C14 and C11 interposed. The drain-drain connecting layer 31b connects a drain region 12h of the driver transistor $Q_4$ to a drain region 12k of the load transistor $Q_6$ with the contact portions C15 and C12 interposed.

First contact pad layers 35a and 35b and a $V_{SS}$ local wiring layer 37 are formed at the same level in which the drain-drain connecting layers 31a and 31b are formed so that the first contact pad layers 35a and 35b and the $V_{SS}$ local wiring layer 37 are stacked over the contact portions C11 to C19, as shown in FIG. 7. The drain-drain connecting layers 31a and 31b, first contact pad layers 35a and 35b, and $V_{SS}$ local wiring layer 37 form the second conductive layer. These layers are formed of, for example, a refractory metal layer, a refractory metal nitride layer, a layer of stacked metal and refractory metal, or a layer of stacked refractory metal and refractory metal nitride. Specific examples include titanium, titanium nitride, a layer of stacked titanium and aluminum, and a layer of stacked titanium and titanium nitride.

The drain-gate connecting layers 41a and 41b in the third conductive layer are formed on a second interlayer dielectric 71 (described later; see FIG. 3) as shown in FIGS. 1, 2, and 8. Second contact portions C21 to C26 (hereinafter called "contact portions C21 to C26") are formed in the second interlayer dielectric 71. Third contact portions C31 and C32 (hereinafter called "contact portions C31 and C32") are formed through the first interlayer dielectric 65 and the second interlayer dielectric 71.

The gate-gate connecting layer 21a and the drain-drain connecting layer 31b are connected by the drain-gate connecting layer 41b with the contact portions C22 and C31 interposed. The gate-gate connecting layer 21b and the drain-drain connecting layer 31a are connected by the drain-gate connecting layer 41a with the contact portions C21 and C32 interposed.

Second contact pad layers 45a and 45b, a $V_{SS}$ contact pad layer 47, and a $V_{DD}$ contact pad layer 49 are formed at the same level in which the drain-gate connecting layers 41a and 41b are formed, as shown in FIG. 8. The second contact pad layers 45a and 45b, $V_{SS}$ contact pad layer 47, and $V_{DD}$ contact pad layer 49 are respectively formed to be stacked on the contact portions C23 to C26. In addition, fourth contact portions C41 to C44 (hereinafter called "contact portions C41 to C44") are formed over these layers. The contact portion C41 is formed to connect a bitline wiring layer (or bit line) to a source/drain region 12a of the access transistor $Q_1$. The contact portion C42 is formed to connect a bitline wiring layer (or bit line BL) 53 as an upper wiring layer (see FIG. 3) to a source/drain region 12c of the access transistor $Q_2$. Note that a source/drain region functions as either a source or a drain. The contact portion C43 is formed to connect the P-type well 11P (see FIG. 3) to a $V_{SS}$ wiring layer (not shown). The contact portion C44 is formed to connect the N-type well 11N (see FIG. 3) to a $V_{DD}$ wiring layer (not shown).

2. Cross-sectional structure

The cross-sectional structure of the SRAM cell according to the present embodiment will be described with reference to FIGS. 3, 4, and 6.

In the SRAM cell according to the present embodiment, the gate-gate connecting layers 21a and 21b, drain-drain connecting layers 31a and 31b, and drain-gate connecting layers 41a and 41b are formed in that order over the silicon substrate 10 and an interlayer dielectric is provided on each of these layers.

The N-type well 11N, P-type well 11P, source/drain regions 12a to 12l, and isolation region 19 are formed on the silicon substrate 10 as shown in FIGS. 3 and 6. The P-type well 11P and the N-type well 11N are electrically isolated by the isolation region 19 (having a thickness of 400 nm, for example). The isolation region 19 is also formed around the active regions of the MOS transistor.

First, the cross section taken along the line B—B of FIG. 1 will be described with reference to FIG. 3.

The drain region 12k of the load transistor $Q_6$ is formed in the N-type well 11N. The drain region 12h of the driver transistor $Q_4$ and the source/drain region 12d of the access transistor $Q_2$ are formed in the P-type well 11p. A silicide layer 122 is formed on each of the source/drain regions 12a to 12l. An insulating layer 126 of silicon nitride is formed on the silicide layer 122.

The sub-word wiring layer 23 is formed over the silicon substrate 10 which includes the MOS transistor. The first interlayer dielectric 65 is formed over the silicon substrate 10. The contact portions C18, C15, and C12 respectively connected to the source/drain regions 12c, 12d (12h), and 12k are formed in the first interlayer dielectric 65.

FIG. 9 shows an enlarged view of a region including the contact portion C15 as an example of the first contact portions.

The silicide layer 122 is formed on the source/drain region 12d (12h). The contact portion C15 is formed of a refractory metal nitride layer 201 connected to the silicide layer 122, and a plug layer 202 formed on the refractory metal nitride layer 201 within a first contact hole 63. The plug layer 202 is formed of tungsten or the like. The refractory metal nitride layer 201 mainly functions as a barrier layer. The first contact hole 63 preferably has an aspect ratio of 6 or less, upper end diameter of 0.22 to 0.32 $\mu$m, and lower end diameter of 0.22 to 0.26 $\mu$m. For example, the first contact hole 63 is formed so that the upper end diameter is 0.30 $\mu$m, lower end diameter is 0.24 $\mu$m, and the aspect ratio is 3 or less.

The drain-drain connecting layer 31b which connects the drain region 12h of the driver transistor $Q_4$ to the drain region 12k of the load transistor $Q_6$ and the first contact pad layer 35b are formed on the first interlayer dielectric 65, as shown in FIG. 3. The first contact pad layer 35b is formed in the same step in which the drain-drain connecting layer 31b is formed. The first contact pad layer 35b is connected to the source/drain region 12c of the access transistor $Q_2$ with the contact portion C18 interposed. The drain-drain connecting layer 31b has a thickness of preferably 50 to 200 nm, and still more preferably 100 to 150 nm. These layers have a sheet resistance of preferably 50 $\Omega/\square$ or less, and still more preferably 15 $\Omega/\square$ or less.

The second interlayer dielectric 71 is formed on the first interlayer dielectric 65. The contact portions C22 and C24 are formed in the second interlayer dielectric 71. The second contact portions such as the contact portions C22 and C24 have the same configuration as the first contact portions, and are formed by filling a second contact hole 79 with a plug layer formed of tungsten or the like. Note that the second contact hole 79 preferably has an aspect ratio of 6 or less, upper end diameter of 0.22 to 0.32 $\mu$m, and lower end diameter of 0.22 to 0.26 $\mu$m. For example, the second contact hole 79 is formed so that the upper end diameter is 0.30 $\mu$m, lower end diameter is 0.24 $\mu$m, and the aspect ratio is 3 or less.

The drain-gate connecting layer 41b is formed on the second interlayer dielectric 71. The drain-gate connecting layer 41b is connected to the drain-drain connecting layer 31b with the contact portion C22 interposed. The second contact pad layer 45b which connects the contact portion C24 to the contact portion C42 is formed in the same step in which the drain-gate connecting layer 41b is formed. The contact portion C42 is connected to the bitline wiring layer 53 (or bit line BL shown in FIG. 5) as an upper wiring layer, whereby the source/drain region 12c of the access transistor $Q_2$ is connected to the bitline wiring layer 53. Signals which flow through the bitline wiring layer 53 and the other bitline wiring layer (bit line BL shown in FIG. 5) complement each other.

The drain-gate connecting layer 41b is formed of, for example, a refractory metal nitride layer 42, a metal layer 44 of aluminum, copper, or alloy thereof, a refractory metal layer 46, and a refractory metal nitride layer 48, which are stacked in that order from the side of the silicon substrate 10. Specifically, the drain-gate connecting layer 41b may be formed by using titanium nitride for the refractory metal nitride layer 42, aluminum for the metal layer 44, titanium for the refractory metal layer 46, and titanium nitride for the refractory metal nitride layer 48. The contact portion C42 has the same configuration as the first contact portions, and is formed by filling a fourth contact hole 83 with a plug layer formed of tungsten or the like. The fourth contact hole 83 preferably has an aspect ratio of 6 or less, upper end diameter of 0.26 to 0.40 $\mu$m, and lower end diameter of 0.26 to 0.30 $\mu$m. For example, the fourth contact hole 83 is formed so that the upper end diameter is 0.36 $\mu$m, lower end diameter is 0.28 $\mu$m, and aspect ratio is 3 or less.

A third interlayer dielectric 85 is formed on the second interlayer dielectric 71, and the bitline wiring layer 53 is formed on the third interlayer dielectric 85. The third interlayer dielectric 85 is formed of, for example, silicon oxide, FSG (fluorine-doped silicon oxide), or a layer formed by stacking these compounds.

A cross-section taken along the line C—C of FIG. 1 will be described with reference to FIGS. 1 and 4. In FIG. 4, the same components as those shown in FIG. 3 are denoted by the same reference numbers, and further description thereof is omitted.

The gate-gate connecting layer 21b is formed over the P-type well 11P and the N-type well 11N which are electrically isolated from each other by the isolation region 19. The driver transistor $Q_4$ and the load transistor $Q_6$ are respectively formed on the P-type well 11P and the N-type well 11N. The driver transistor $Q_4$ is connected to the load transistor $Q_6$ by the gate-gate connecting layer 21b.

The silicide layer 124 and the insulating layer 126 which is formed of silicon nitride or the like are stacked on the gate-gate connecting layer 21b in that order. The first interlayer dielectric 65 and the second interlayer dielectric 71 are formed over the insulating layer 126. The drain-gate connecting layer 41a is formed on the second interlayer dielectric 71. A contact portion C32 is formed through the first interlayer dielectric 65 and the second interlayer dielectric 71. The gate-gate connecting layer 21b is connected to the drain-gate connecting layer 41a by the contact portion C32. The contact portion C32 has the same configuration as the first contact portions, and is formed by filling a third contact hole 77 with a plug layer formed of tungsten or the like. The third contact hole 77 preferably has an aspect ratio of 6 or less, upper end diameter of 0.22 to 0.32 μm, and lower end diameter of 0.22 to 0.26 μm. For example, the third contact hole 77 is formed so that the upper end diameter is 0.32 μm, lower end diameter is 0.24 μm, and aspect ratio is 6 or less.

In the SRAM cell of the present embodiment having the above configuration, the distance X between the silicon substrate 10 and the drain-drain connecting layers 31a and 31b shown in FIG. 3 is preferably 300 to 1000 nm, and still more preferably 600 to 800 nm. The distance Y between the drain-drain connecting layers 31a and 31b and the drain-gate connecting layers 41a and 41b is preferably 200 to 600 nm, and still more preferably 300 to 500 nm. The distance Z between the silicon substrate 10 and the drain-gate connecting layers 41a and 41b is preferably 1400 nm or less. A semiconductor memory device exhibiting sufficient conductivity with a reduced size can be achieved by satisfying these conditions.

3. Electrical connection of components

Electrical connection of components will be described with reference to FIGS. 2, 5, and 6.

The access transistor $Q_1$ includes the $n^+$-type source/drain regions 12a and 12b, respectively provided on one side of the sub-word wiring layer 23. The source/drain region 12a is connected to the bitline wiring layer 53 (or bit line BL shown in FIG. 5) through the contact portion C16, first contact pad layer 35a, contact portion C23, second contact pad layer 45a, and contact portion C41.

The access transistor $Q_2$ includes the $n^+$-type source/drain regions 12c and 12d, respectively provided one one side of the sub-word wiring layer 23. The source/drain region 12c is connected to the bitline wiring layer 53 (or bit line BL shown in FIG. 5) through the contact portion C18, first contact pad layer 35b, contact portion C24, second contact pad layer 45b, and contact portion C42.

The driver transistor $Q_3$ includes the $n^+$-type source/drain regions 12e and 12f, respectively provided on one side of the gate-gate connecting layer 21a. The source region 12e is connected to the $V_{SS}$ wiring layer (corresponding to $V_{SS}$ shown in FIG. 5) through the contact portion C13, $V_{SS}$ local wiring layer 37, contact portion C25, $V_{SS}$ contact pad layer 47, and contact portion C43.

The driver transistor $Q_4$ includes the $n^+$-type source/drain regions 12g and 12h, respectively provided on one side of the gate-gate connecting layer 21b. The source region 12g is connected to the $V_{SS}$ wiring layer by the route common to the source region 12e.

The load transistor $Q_5$ includes the $p^+$-type source/drain regions 12i and 12j, respectively provided on one side of the gate-gate connecting layer 21a. The source region 12j is connected to the $V_{DD}$ wiring layer (corresponding to $V_{DD}$ shown in FIG. 5) through the contact portion C19, $V_{DD}$ wiring layer 33, contact portion C26, $V_{DD}$ contact pad layer 49, and contact portion C44.

The load transistor $Q_6$ includes the $p^+$-type source/drain regions 12k and 12l, respectively provided on one side of the gate-gate connecting layer 21b. The source region 12l is connected to the $V_{DD}$ wiring layer by the route common to the source region 12j.

Fabrication Process

An example of the method of fabricating the SRAM cell according to the present embodiment will be described with reference to FIGS. 1 to 4.

(1) The isolation region 19 shown in FIG. 4 is formed by the shallow trench isolation (STI) method. A silicon oxide layer and a silicon nitride layer are deposited over the P-type silicon substrate 10 in that order. After forming a resist with a predetermined pattern thereon, the silicon substrate 10 is etched, thereby forming grooves. After oxidizing the surface of the exposed grooves, the grooves are filled with a silicon oxide layer by the high density plasma (HDP) method or the like. The silicon oxide layer outside the grooves is planarized by the chemical mechanical polishing (CMP) method. After removing the silicon nitride layer, a resist with a predetermined pattern is formed on the surface of the substrate. The N-type well 11N is then formed in the predetermined position by ion implantation. The P-type well 11P is formed by the same method. Then, the gate insulating layer 123 is formed by thermally oxidizing the surface of the N-type well 11N and the P-type well lip.

A polysilicon layer is formed on the insulating layer by the CVD method. Part of the polysilicon layer is patterned by photoetching, thereby forming the gate-gate connecting layers 21a and 21b and the sub-word wiring layer 23.

(2) An insulating layer formed of silicon oxide and silicon nitride is deposited on the sidewalls of the polysilicon layer by the CVD method. The insulating layer is anisotropically etched by dry etching such as RIE, thereby forming sidewall insulating layers 127 and 128 on the sidewalls of the gate-gate connecting layers 21a and 21b and the sub-word wiring layer 23.

High-concentration N-type impurities such as phosphorus or arsenic and high-concentration P-type impurities such as boron are respectively introduced into the active region of the P-type well 11P and the active region of the N-type well 11N, using the gate-gate connecting layers 21a and 21b and the sub-word wiring layer 23 as masks, thereby forming the source/drain regions 12a to 12l. At this time, the gate-gate connecting layers 21a and 21b and the sub-word wiring layer 23 are also doped with predetermined N-type or P-type impurities.

Then, the silicide layers 122 and 124 containing a refractory metal such as titanium or cobalt are formed on the exposed surfaces of the source/drain regions 12a to 12l, gate-gate connecting layers 21a and 21b, and the sub-word wiring layer 23 by the conventional salicide technique.

(3) The insulating layer 126 containing silicon nitride, for example, as a major component is formed over the surface of the semiconductor substrate on which the MOS transistors $Q_1$ to $Q_6$ and the isolation region 19 are formed, on the gate-gate connecting layers 21a and 21b, and on the sub-word wiring layer 23 by the plasma CVD method or the like. The insulating layer 126 functions as a stopper for preventing the lower ends of the first contact portions from contacting the isolation region 19 in the case where the first contact portions deviate from the predetermined positions when forming the first contact portions in a step described later. The first interlayer dielectric 65 is then formed on the insulating layer 126 by the HDP method, ozone tetraethyl orthosilicate (TEOS) method, or the like. The first interlayer dielectric 65 is planarized to a thickness of 300 to 1000 nm by the CMP method, as required. In order to obtain the first interlayer dielectric 65 with a flatter surface, the first interlayer dielectric 65 may be stacked after forming a dummy pattern with the same configuration as the gate-gate connecting layers 21a and 21b in the predetermined region excluding active regions, N-type well 11N, and P-type well 11P and others when forming the gate-gate connecting layers 21a and 21b.

(4) The first contact hole 63 is formed in the predetermined region of the first interlayer dielectric 65 by photoetching. In this step, it is preferable to form a photoresist after forming an organic antireflection film on the first interlayer dielectric 65. This ensures that light will be uniformly irradiated on the first interlayer dielectric 65 during exposure, whereby a precise pattern can be formed with higher accuracy. It is preferable to use a half-tone mask for exposure. A half-tone mask has a mask pattern formed of a translucent film instead of chromium or the like. Use of the half-tone mask provides a phase difference to light which has leaked out from the translucent film, thereby emphasizing the edge of the resist pattern.

The following description is given using the contact portion C15 as an example with reference to FIG. 9. The refractory metal nitride layer 201 such as titanium nitride layer is formed on the inside surface of the first contact hole 63 by sputtering. The plug layer 202 of tungsten or the like is formed within the first contact hole 63. Then, the first contact portion C15 is formed by planarizing the surface of the plug layer 202 in the first contact hole 63 by etching, the CMP method, or a combination of these methods.

A refractory metal nitride layer is formed on the plug layer 202 and the first interlayer dielectric 65 by sputtering. The drain-drain connecting layers 31a and 31b, first contact pad layers 35a and 35b, and $V_{SS}$ local wiring layer 37 are formed by patterning the refractory metal nitride layer by photoetching. In this step, it is also preferable to use an organic antireflection film during photoetching.

As the refractory metal nitride layer which forms the drain-drain connecting layers 31a and 31b and others, a nitride layer of a metal selected from titanium, tungsten, cobalt, molybdenum, and the like is preferable. As the plug layer 202, molybdenum, aluminum, doped polysilicon, copper, or the like is used in addition to tungsten.

The drain-drain connecting layers 31a and 31b, first contact pad layers 35a and 35b, and $V_{SS}$ local wiring layer 37 may have a two-layer structure consisting of a refractory metal layer and a refractory metal nitride layer. In this case, these layers are formed by forming a refractory metal layer on the plug layer 202 and the first interlayer dielectric 65, and then forming a refractory metal nitride layer. As the refractory metal, a metal selected from titanium, tungsten, cobalt, molybdenum, and the like is preferable.

(5) An insulating layer is formed on the drain-drain connecting layer 31a and 31b, first contact pad layers 35a and 35b, $V_{SS}$ local wiring layer 37, and first interlayer dielectric 65 by the HDP method, ozone TEOS method, or the like. The surface of the insulating layer may be planarized by the CMP method if necessary, thereby forming the second interlayer dielectric 71.

The third contact hole 77 is formed through the first interlayer dielectric 65 and the second interlayer dielectric 71 in the predetermined region by photoetching. It is preferable to perform photoetching by forming an organic antireflection film on the second interlayer dielectric 71, and by using a half-tone mask. Then, the contact portions C31 and C32 are formed within the third contact hole 77 by the same method used to form the first contact portions.

The contact portions C21 to C26 are formed in the predetermined regions of the second interlayer dielectric 71 by using the same material and method used to form the contact portions C31 and C32. The contact portions C21 to C26 are respectively connected to the drain-drain connecting layers 31a and 31b, first contact pad layers 35a and 35b, and $V_{SS}$ local wiring layer 37, and $V_{DD}$ wiring layer 33.

(6) The succeeding steps may be carried out by conventional methods. For example, the refractory metal nitride layer 42 such as a titanium nitride layer, metal layer 44 of a metal such as aluminum or copper, the refractory metal layer 46 such as a titanium layer, and the refractory metal nitride layer 48 such as a titanium nitride layer are formed on the second interlayer dielectric 71 and the contact portions C21 to C26 by sputtering. After forming a hard mask layer 40, as required, an organic antireflection film is formed thereon. After forming a photoresist with a predetermined pattern, these layers are etched, thereby forming the drain-gate connecting layers 41a and 41b, second contact pad layers 45a and 45b, $V_{SS}$ contact pad layer 47, and $V_{DD}$ contact pad layer 49. The third interlayer dielectric 85 is then formed over these layers by the HDP method, plasma CVD, or the like. The third interlayer dielectric 85 is preferably formed of silicon oxide, FSG, or a layer formed by stacking these compounds. Then, the contact portions C41 to C44 are formed in the predetermined regions of the second contact pad layers 45a and 45b, $V_{SS}$ contact pad layer 47, and $V_{DD}$ contact pad layer 49. After a conductive layer of aluminum, copper, or alloys of these metals, a hard mask layer and others are formed, a resist pattern is formed thereon. These layers are etched into a predetermined pattern, thereby forming the bitline wiring layer (bit line/BL) 53, $V_{SS}$ wiring layer, and $V_{DD}$ wiring layer. An insulating layer formed of silicon oxide is formed thereon by the HDP method or the like, and a passivation layer formed of silicon nitride or the like is formed thereon.

As described above, according to the present invention, since the patterns of each layer can be simplified and easily subjected to microprocessing, a semiconductor memory device with a reduced size, for example, a 0.18 μm design rule SRAM with a memory cell size of 4.5 μm² or less can be fabricated. Moreover, the thickness of the drain-drain connecting layer can be reduced, whereby processing with higher accuracy can be ensured. This increases yield.

Note that this invention is not limited to the above embodiment, and various modifications can be made within the scope of the invention.

What is claimed is:
1. A semiconductor memory device comprising:
memory cells each of which includes two load transistors, two driver transistors, and two access transistors, wherein:
each of the memory cells includes first and second gate-gate connecting layers, first and second drain-drain connecting layers, and first and second drain-gate connecting layers;
the first and second gate-gate connecting layers are formed over a semiconductor substrate;
the first and second drain-drain connecting layers are formed over a first interlayer dielectric and connect drains of the load transistors with drains of the driver transistors;
the first and second drain-gate connecting layers are formed over a second interlayer dielectric;

the first drain-gate connecting layer connects the first drain-drain connecting layer to the second gate-gate connecting layer;

the second drain-gate connecting layer connects the second drain-drain connecting layer to the first gate-gate connecting layer; and the first and second gate-gate connecting layers, the first and second drain-drain connecting layers, and the first and second drain-gate connecting layers are formed in different layers.

2. The semiconductor memory device as defined in claim 1, wherein each of the first and second drain-drain connecting layers has a thickness of 50 to 200 nm.

3. The semiconductor memory device as defined in claim 1, wherein each of the first and second drain-drain connecting layers has a sheet resistance of 50 Ω/□ or less.

4. The semiconductor memory device as defined in claim 1, further comprising:

first contact portions formed in the first interlayer dielectric;

second contact portions formed in the second interlayer dielectric; and third contact portions formed through the first interlayer dielectric and second interlayer dielectric.

5. The semiconductor memory device as defined in claim 4, wherein the first and second gate-gate connecting layers are connected to the first and second drain-drain connecting layers by the first contact portions.

6. The semiconductor memory device as defined in claim 4, wherein the first and second gate-gate connecting layers are connected to the first and second drain-gate connecting layers by the third contact portions.

7. The semiconductor memory device as defined in claim 4, further comprising:

first contact pad layers which are formed in the same step of forming the first and second drain-drain connecting layers and used to connect a bit line to source/drain regions of the access transistors;

wherein the second contact portions are formed over the first contact portions with the first contact pad layers interposed.

8. The semiconductor memory device as defined in claim 4, wherein the second contact portions are formed over the first and second drain-drain connecting layers and connect the first and second drain-drain connecting layers to the first and second drain-gate connecting layers.

9. The semiconductor memory device as defined in claim 4, wherein contact holes of the third contact portions have an aspect ratio of 6 or less.

10. The semiconductor memory device as defined in claim 1, wherein each of the first and second drain-drain connecting layers includes a refractory metal nitride layer.

11. The semiconductor memory device as defined in claim 10, wherein each of the first and second drain-drain connecting layers further includes a refractory metal layer.

12. The semiconductor memory device as defined in claim 1, wherein an insulating layer containing silicon nitride and silicon oxide is formed over the semiconductor substrate.

13. The semiconductor memory device as defined in claim 1, wherein the distance between the semiconductor substrate and the first and second drain-drain connecting layers is 300 to 1000 nm.

14. The semiconductor memory device as defined in claim 1, wherein the distance between the first and second drain-drain connecting layers and the first and second drain-gate connecting layers is 200 to 600 nm.

15. The semiconductor memory device as defined in claim 11 wherein the distance between the semiconductor substrate and the first and second drain-gate connecting layers is 1400 nm or less.

16. The semiconductor memory device as defined in claim 1, wherein each of the memory cells includes an upper wiring layer formed over a third interlayer dielectric.

17. The semiconductor memory device as defined in claim 16, wherein the upper wiring layer is a bitline wiring layer.

18. A method of fabricating a semiconductor memory device comprising the steps of:

(a) forming a plurality of memory cells in a predetermined regions of a semiconductor substrate, each of the memory cells including two load transistors, two driver transistors, and two access transistors;

(b) forming gate-gate connecting layers over the semiconductor substrate;

(c) forming a first interlayer dielectric over the semiconductor substrate and the gate-gate connecting layers;

(d) forming drain-drain connecting layers over the first interlayer dielectric;

(e) forming a second interlayer dielectric over the drain-drain connecting layers and the first interlayer dielectric; and (f) forming drain-gate connecting layers over the second interlayer dielectric.

19. The method of fabricating a semiconductor memory device as defined in claim 18, wherein an insulating layer containing silicon nitride and silicon oxide is formed over the semiconductor substrate after the step (b).

20. The method of fabricating a semiconductor memory device as defined in claim 18, further comprising the steps of:

(g) forming first contact portions in the first interlayer dielectric;

(h) forming third contact portions through the first interlayer dielectric and the second interlayer dielectric; and (i) forming second contact portions in the second interlayer dielectric.

21. The method of fabricating a semiconductor memory device as defined in claim 20, wherein first contact pad layers which connect the first contact portions to the second contact portions are formed over the first interlayer dielectric together with the first and second drain-drain connecting layers in the step (d).

* * * * *